US006856198B2

(12) United States Patent
Jaussi et al.

(10) Patent No.: US 6,856,198 B2
(45) Date of Patent: Feb. 15, 2005

(54) AMPLIFIER AND METHOD FOR VOLTAGE-TO-CURRENT CONVERSION

(75) Inventors: James E. Jaussi, Hillsboro, OR (US); David J. Comer, Springville, UT (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/328,726

(22) Filed: Dec. 23, 2002

(65) Prior Publication Data

US 2004/0119537 A1 Jun. 24, 2004

(51) Int. Cl.[7] ................................................ H03F 3/45
(52) U.S. Cl. ...................................... 330/253; 330/257
(58) Field of Search ................................ 330/253, 257, 330/258, 261; 327/359

(56) References Cited

U.S. PATENT DOCUMENTS

| | | | | |
|---|---|---|---|---|
| 4,267,519 A | * | 5/1981 | Schade, Jr. ................. | 330/255 |
| 4,797,583 A | * | 1/1989 | Ueno et al. .................... | 326/66 |
| 4,800,339 A | * | 1/1989 | Tanimoto et al. ........... | 330/253 |
| 6,614,302 B2 | * | 9/2003 | Abe ........................... | 330/253 |

* cited by examiner

Primary Examiner—Henry Choe
(74) Attorney, Agent, or Firm—Schwegman, Lundberg, Woessner & Kluth, P.A.

(57) ABSTRACT

An amplifier includes a differential unit including an input port to receive a voltage input signal, a current mirror unit including an output port, and a voltage-to-current conversion unit to couple the differential unit to the current mirror unit and to generate a current signal to drive the current mirror unit to generate a current output signal at the output port. A method includes receiving a voltage input signal at an input port of a differential unit, converting the voltage input signal to a current signal, and driving a current mirror with the current signal to generate an current output signal at an output port.

14 Claims, 13 Drawing Sheets

AMPLIFIER AND METHOD FOR VOLTAGE-TO-CURRENT CONVERSION

FIELD

This invention relates to amplifiers and, more particularly, to amplifiers that convert a voltage signal to a current signal.

BACKGROUND

A voltage-to-current amplifier converts a voltage signal to a current signal. Current signals are used in information processing systems, communication systems, and information storage systems. For example, in an information processing system, a current signal can represent information within the system. In a communication system, a current signal can provide the drive current for current mode devices, such as a laser or a light-emitting diode. In an information storage system, a current signal can provide the drive current for a magnetic recording head.

The demand for information processing systems, communication systems, and information storage systems having higher operating frequencies continues. However, an increase in the operating frequency of these systems requires a corresponding increase in the operating frequency of the components, such as voltage-to-current amplifiers, used in these systems. Transient response is a parameter related to the operating frequency of a voltage-to-current amplifier. Generally, an improvement in the transient response of a voltage-to-current amplifier corresponds to an increase in the amplifier's operating frequency. Over the last several decades, many different voltage-to-current amplifier designs have been developed to improve the transient response of voltage-to-current amplifiers. Unfortunately, despite the development of improved designs, the voltage-to-current amplifiers in use today fail to have a sufficiently fast transient response to meet the operating frequency specifications of future information processing systems, communication systems, and information storage systems. This failure eliminates these amplifiers from consideration for use in these systems.

BRIEF DESCRIPTION OF THE DRAWINGS

FIG. 1I is a schematic diagram of an amplifier that includes all of the elements of the amplifier shown in FIG. 1G except for the current mirror of the amplifier shown in FIG. 1G in accordance with another embodiment of the present invention.

DESCRIPTION

Figure 1A:
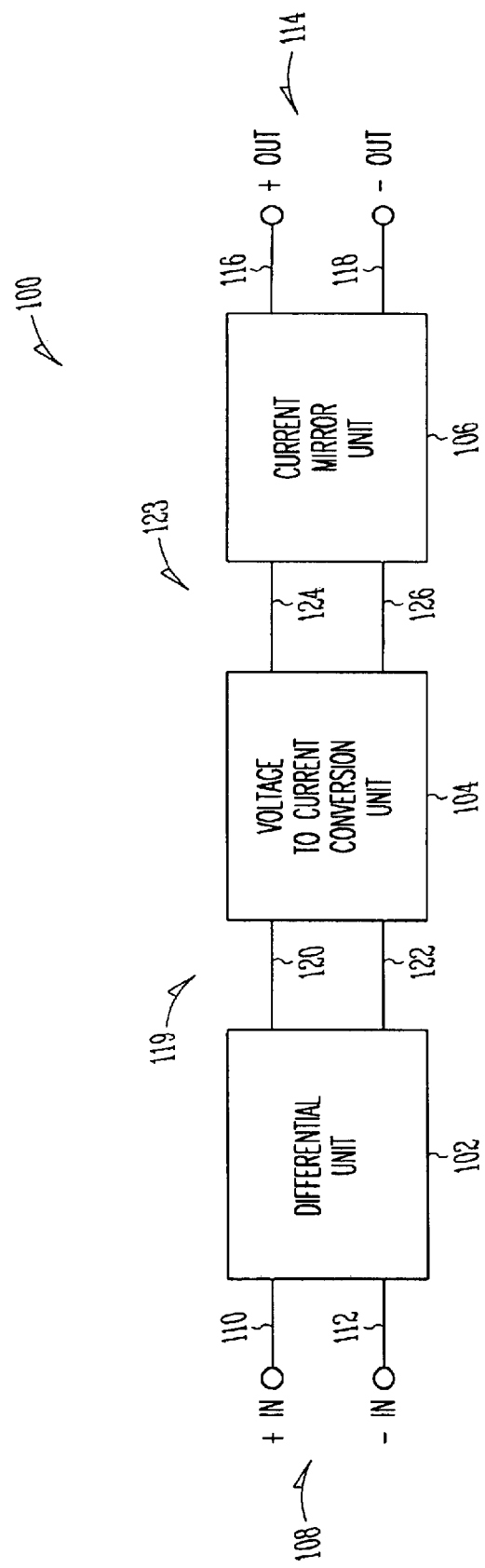
FIG. 1A is a block diagram of an amplifier in accordance with one embodiment of the present invention.

In the following detailed description of some embodiments of the present invention, reference is made to the accompanying drawings which form a part hereof, and in which are shown, by way of illustration, specific embodiments of the present invention which may be practiced. In the drawings, like numerals describe substantially similar components throughout the several views. These embodiments are described in sufficient detail to enable those skilled in the art to practice the present invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

FIG. 1A is a block diagram of an amplifier 100 in accordance with one embodiment of the present invention. The amplifier 100 includes a differential unit 102, a voltage-to-current conversion unit 104, and a current mirror unit 106. The differential unit 102 includes an input port 108 including input terminals 110 and 112. The current mirror unit 106 includes an output port 114 including output terminals 116 and 118. The voltage-to-current conversion unit 104 couples the differential unit 102 to the current mirror unit 106. The voltage-to-current conversion unit 104 is coupled to the differential unit 102 at a coupling port 119 including terminals 120 and 122 and to the current mirror unit 106 at a coupling port 123 including terminals 124 and 126.

Figure 1B:
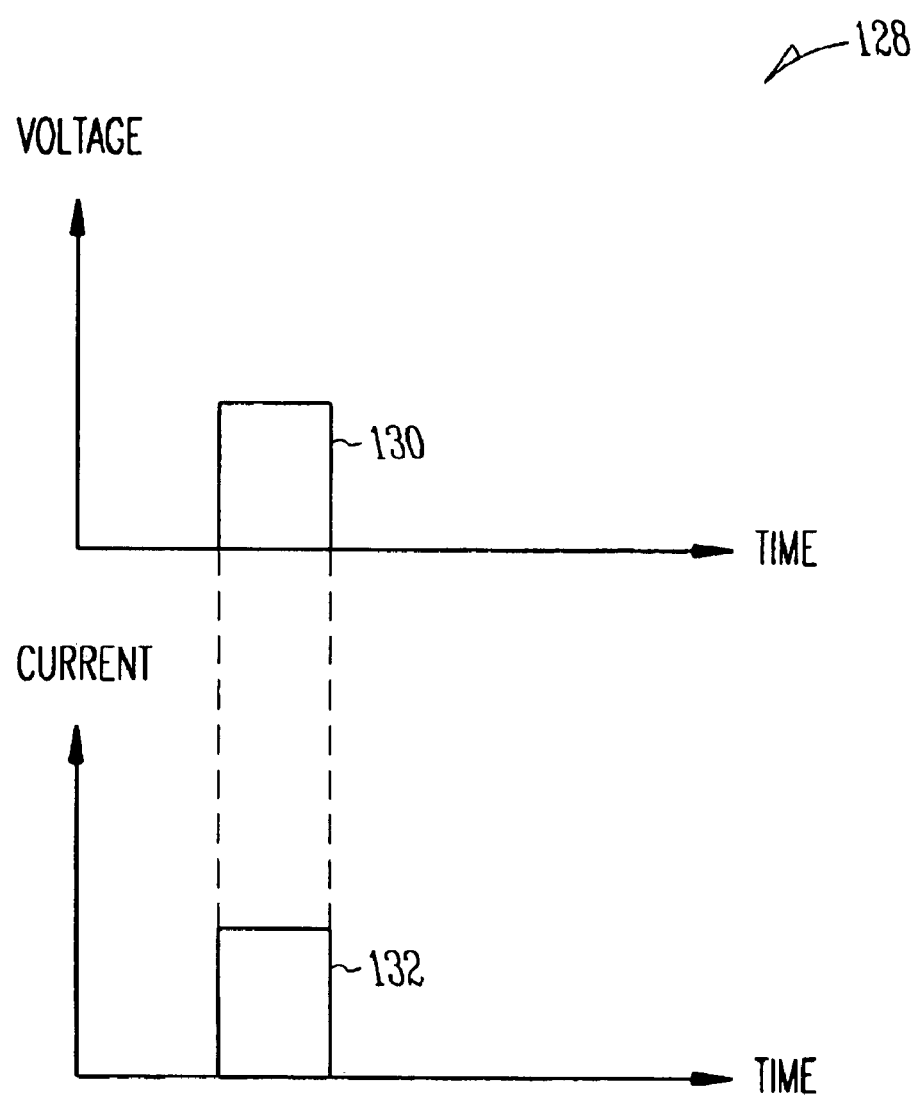
FIG. 1B is an illustration of an exemplary pair of timing diagrams illustrating a voltage input signal, suitable for processing by the amplifier shown in FIG. 1A, and a current output signal generated by the amplifier.

FIG. 1B is an illustration of an exemplary pair of timing diagrams 128 illustrating a voltage input signal 130, suitable for processing by the amplifier 100 shown in FIG. 1A, and a current output signal 132 generated by the amplifier 100. The voltage input signal 130 and the current output signal 132 are differential signals formed by generating the difference between two signals. Differential signals used in digital signaling, such as the voltage input signal 130, can be formed by generating the difference between substantially symmetrical signals having opposite polarities.

Referring again to FIG. 1A, in one example of operation, the amplifier 100 receives the voltage input signal 130 (shown in FIG. 1B) at the input port 108 and generates the current output signal 132 (shown in FIG. 1B) at the output port 114. The differential unit 102 processes the voltage input signal 130 to produce a differential voltage signal (not shown) at the coupling port 119. The voltage-to-current conversion unit 104 receives the differential voltage signal at the coupling port 119 and processes the differential voltage signal to form the differential current signal (not shown) at the coupling port 123. The current mirror unit 106 receives the differential current signal at the coupling port 123 and generates the current output signal 132 at the output port 114. Thus, the voltage input signal 130 is converted to the current output signal 132. The current output signal 132 is a substantially linear function of the voltage input signal 130. Thus, the voltage-to-current conversion unit 104 is a substantially linear voltage-to-current converter, and the amplifier 100 is a substantially linear amplifier.

Figure 1C:
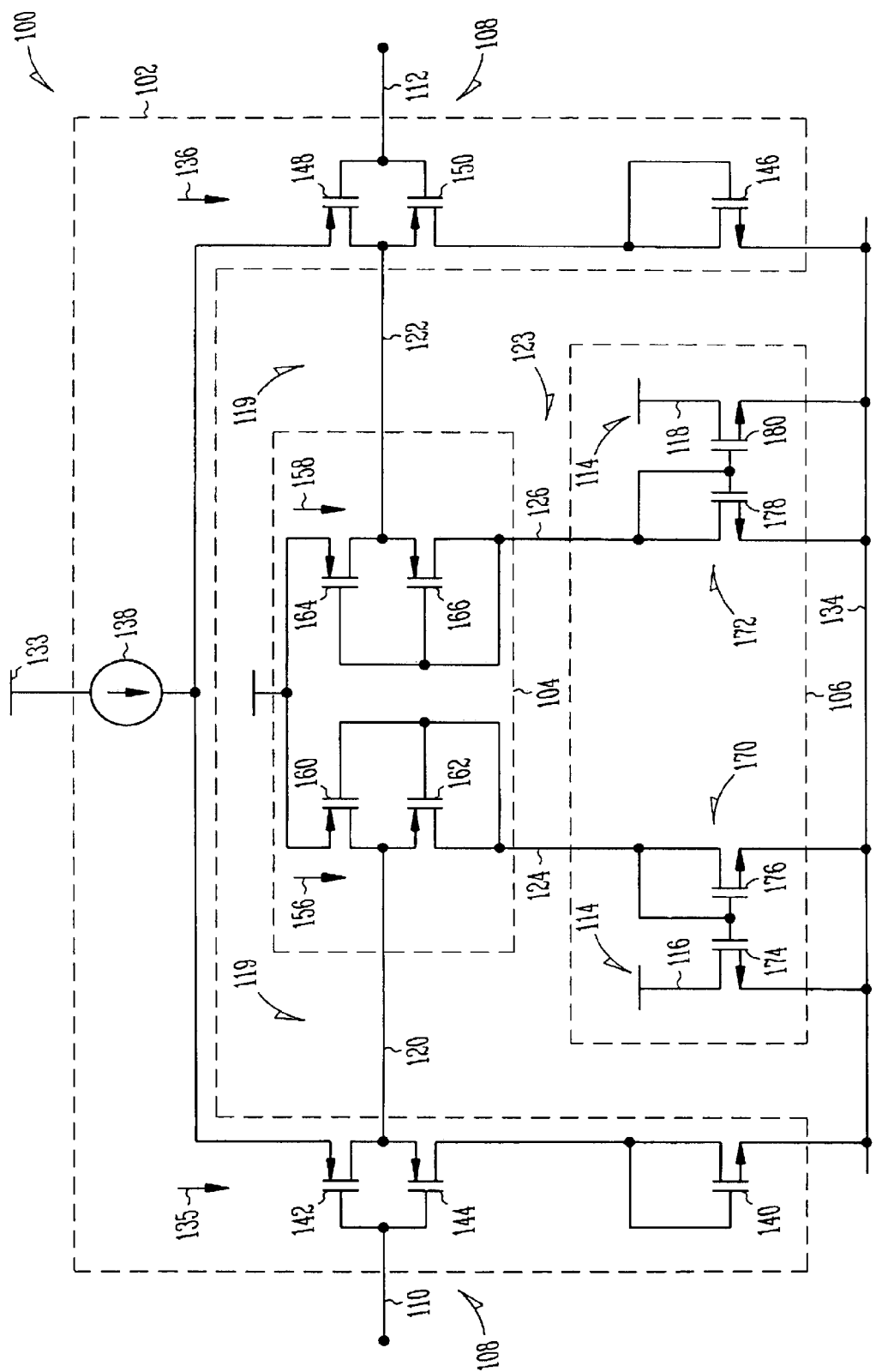
FIG. 1C is a schematic diagram of the amplifier shown in FIG. 1A in accordance with another embodiment of the present invention.

FIG. 1C is a schematic diagram of the amplifier 100 shown in FIG. 1A in accordance with another embodiment of the present invention. The amplifier 100 includes the differential unit 102, the voltage-to-current conversion unit 104, and the current mirror unit 106. The differential unit 102 is coupled to the voltage-to-current conversion unit 104 at the coupling port 119 including terminals 120 and 122. The voltage-to-current conversion unit 104 is coupled to the current mirror unit 106 at the coupling port 123 including terminals 124 and 126. A first supply potential is provided at node 133 and a second supply potential is provided at node 134.

The differential unit 102 includes current paths 135 and 136. The current path 135 includes three elements. The first element is a current source 138. The second element is a diode connected insulated gate field-effect transistor 140. The third element is a pair of insulated gate field-effect transistors 142 and 144 that connects the current source 138 to the diode connected insulated gate field-effect transistor 140.

The current path 136 also includes three elements. The first element is the current source 138. The second element is a diode connected insulated gate field-effect transistor 146. The third element is a pair of insulated gate field-effect transistors 148 and 150 that connects the current source 138 to the diode connected insulated gate field-effect transistor 146.

The current source 138 provides current, which is sometimes referred to as bias current, to the current paths 135 and 136. The current source 138 is not limited to a particular current source configuration. Exemplary current source configurations suitable for use in connection with the amplifier 100 include simple two-transistor configurations, cascode configurations, and Wilson configurations.

The diode connected insulated gate field-effect transistor 140 provides a load to decrease the potential across the pair of insulated gate field-effect transistors 142 and 144. The diode connected insulated gate field-effect transistor 146 provides a load to decrease the potential across the pair of insulated gate field-effect transistors 148 and 150.

The diode connected insulated gate field-effect transistors 140 and 146 can be formed on a semiconductor substrate. In one embodiment, the diode connected insulated gate field-effect transistor 140 includes a material having n-type conductivity. Materials having n-type conductivity are formed by the addition of dopants to a host material where the dopants have a valency one more than the host atom. For example, n-type silicon is formed by adding elements such as arsenic, phosphorus, or antimony to silicon.

The pair of insulated gate field-effect transistors 142 and 144 is stacked in an active cascode source follower configuration or connection. A common gate node is formed by coupling two gates together. The gate terminals of the pair of insulated gate field-effect transistors 142 and 144 are coupled to the input terminal 110 to form a common gate node at the input terminal 110. A common drain/source node is formed by coupling two drain/source nodes together. A drain/source of one of the pair of insulated gate field-effect transistors 142 and 144 is coupled to a drain/source of the other of the pair of insulated gate field-effect transistors 142 and 144 to form a common drain/source node at the terminal 120. One of the remaining drain/source nodes of the pair of insulated gate field-effect transistors 142 and 144 is coupled to the current source 138. The other remaining drain/source node of the pair of insulated gate field-effect transistors 142 and 144 is coupled to the diode connected insulated gate field-effect transistor 140.

In operation, the insulated gate field-effect transistor 142 is in the triode region and the insulated gate field-effect transistor 144 is in the active region. The insulated gate field-effect transistor 142 provides a load (a small triode resistance) for the insulated gate field-effect transistor 144, which is configured as a source follower. This arrangement of transistors provides a fast transient response suitable for use in processing fast signals, such as signals used in high-speed digital signaling applications. The use of the insulated gate field-effect transistor 142 as a load for the insulated gate field-effect transistor 144 also eliminates the need for an additional bias source as required for a current-source load.

The pair of insulated gate field-effect transistors 148 and 150 is stacked in an active cascode source follower configuration or connection. As noted above, a common gate node is formed by coupling two gates together. The gate terminals of the insulated gate field-effect transistors 148 and 150 are coupled to the input terminal 112 to form a common gate node at the input terminal 112. Also, as noted above, a common drain/source node is formed by coupling two drain/source nodes together. A drain/source of one of the pair of insulated gate field-effect transistors 148 and 150 is coupled to a drain/source of the other of the pair of insulated gate field-effect transistors to form a common drain/source node at the terminal 122. One of the remaining drain/source nodes of the pair of insulated gate field-effect transistors 148 and 150 is coupled to the current source 138 while the other remaining drain/source node of the pair of insulated gate field-effect transistors 148 and 150 is coupled to the diode connected insulated gate field-effect transistor 146.

In operation, the insulated gate field-effect transistor 148 is in the triode region and the insulated gate field-effect transistor 150 is in the active region. The insulated gate field-effect transistor 148 provides a load (a small triode resistance) for the insulated gate field-effect transistor 150, which is configured as a source follower. This arrangement of transistors provides a fast transient response suitable for use in processing fast signals, such as signals used in high-speed digital signaling applications. The use of the insulated gate field-effect transistor 148 as a load for the insulated gate field-effect transistor 150 also eliminates the need for an additional bias source as required for a current-source load.

In operation, the differential unit 102, including the current source 138, the pair of insulated gate field-effect transistors 142 and 144, the pair of insulated gate field-effect transistors 148 and 150, and the diode connected insulated gate field-effect transistors 140 and 146, divides the current provided by the current source 138 between the current path 135 and the current path 136. The amount of current in each of the current paths 135 and 136 is controlled by the signal at the input port 108 including the input terminals 110 and 112. The voltage at the coupling port 119 is controlled by the difference between the input signals at the input terminals 110 and 112. The voltage at the coupling port 119 is provided to the voltage-to-current conversion unit 104.

The voltage-to-current conversion unit 104 includes a current path 156 and a current path 158. The current path 156 includes a pair of insulated gate field-effect transistors 160 and 162 coupled to the current mirror unit 106 at the terminal 124. The current path 158 includes a pair of insulated gate field-effect transistors 164 and 166 coupled to the current mirror unit 106 at the terminal 126.

The pair of insulated gate field-effect transistors 160 and 162 is stacked in an active cascode source follower configuration or connection. As noted above, a common gate node is formed by coupling two gates together. The gate terminals of the pair of insulated gate field-effect transistors 160 and 162 are coupled together to form a common gate node. The common gate node is coupled to a drain/source of one of the pair of insulated gate filed-effect transistors 160 and 162. Also, as noted above, a common drain/source node is formed by coupling two drain/source nodes together. A drain/source node of the insulated gate field-effect transistor 160 is coupled to a drain/source node of the insulated gate filed effect transistor 162 to form a common drain/source node at the terminal 120. The common drain/source node at the terminal 120 is coupled to the common drain source node of the pair of insulated gate field effect transistors 142 and 144 of the differential unit 102 at the terminal 120.

In operation, the insulated gate field-effect transistor 160 is in the triode region and the insulated gate field-effect transistor 162 is in the active region. The insulated gate field-effect transistor 160 provides a load (a small triode resistance) for the insulated gate field-effect transistor 162. Since the common drain/source node of the pair of insulated gate field-effect transistors 142 and 144 is coupled to the pair of insulated gate field-effect transistors 160 and 162 at the terminal 120, changes in the voltage at the common drain/source node of the pair of insulated gate field-effect transistors 142 and 144 are coupled to the common drain/source node of the pair of insulated gate field-effect transistors 160 and 162. A change in the voltage at the common drain/source node of the pair of insulated gate field-effect transistors 160 and 162 results in a change in the current in the current path 156. Thus, a voltage at the common drain/source node at the terminal 120 is converted to a current in the current path 156. This arrangement of transistors provides a fast transient response suitable for use in processing fast signals, such as signals used in high-speed digital signaling applications.

The pair of insulated gate field-effect transistors 164 and 166 is stacked in an active cascode source follower configuration or connection. As noted above, a common gate node is formed by coupling two gates together. The gate terminals of the insulated gate field-effect transistors 164 and 166 are coupled together to form a common gate node. The common gate node is coupled to a drain/source of one of the pair of insulated gate filed-effect transistors 164 and 166. Also, as noted above, a common drain/source node is formed by coupling two drain/source nodes together. A drain/source of the insulated gate field-effect transistor 164 is coupled to a drain/source of the insulated gate filed effect transistor 166 to form a common drain/source node at the terminal 122. The common drain/source node at the terminal 122 is coupled to the common drain source node of the pair of insulated gate field effect transistors 148 and 150 of the differential unit 102 at the terminal 122.

In operation, the insulated gate field-effect transistor 164 is in the triode region and the insulated gate field-effect transistor 166 is in the active region. The insulated gate field-effect transistor 164 provides a load (a small triode resistance) for the insulated gate field-effect transistor 166. Since the common drain/source node of the pair of insulated gate field-effect transistors 148 and 150 is coupled to the pair of insulated gate field-effect transistors 164 and 166 at the terminal 122, changes in the voltage at the common drain/source node of the pair of insulated gate field-effect transistors 148 and 150 are coupled to the common drain/source node of the pair of insulated gate field-effect transistors 164 and 166. A change in the voltage at the common drain/source node of the pair of insulated gate field-effect transistors 164 and 166 results in a change in the current in the current path 158. Thus, a voltage at the common drain/source node at the terminal 122 is converted to a current in the current path 158. This arrangement of transistors provides a fast transient response suitable for use in processing fast signals, such as signals used in high-speed digital signaling applications.

The current mirror unit 106 includes a current mirror 170 and a current mirror 172. The current mirror 170 is coupled to the voltage-to-current conversion unit 104 at the terminal 124. The current mirror 170 includes a pair of insulated gate field-effect transistors 174 and 176. The gates of the pair of insulated gate field-effect transistors 174 and 176 are coupled together to form a common gate node. The common gate node is coupled to a drain/source node of the insulated gate field-effect transistor 176. A drain/source of the insulated gate field-effect transistor 174 forms the output terminal 116.

In operation, the current mirror 170 is included in the current path 156, so the current that flows through the pair of insulated gate field-effect transistors 160 and 162 flows through the insulated gate field-effect transistor 176 and is mirrored at the output terminal 116.

The current mirror 172 is coupled to the voltage-to-current conversion unit 104 at the terminal 126. The current mirror 172 includes a pair of insulated gate field-effect transistors 178 and 180. The gates of the pair of insulated gate field-effect transistors 178 and 180 are coupled together to form a common gate node. The common gate node is coupled to a drain/source node of the insulated gate field-effect transistor 178. A drain/source of the insulated gate field-effect transistor 180 forms the output terminal 118.

In operation, the current mirror 172 is included in the current path 158, so the current that flows through the pair of insulated gate field-effect transistors 164 and 166 flows through the insulated gate field-effect transistor 178 and is mirrored at the output terminal 118.

In operation, the amplifier 100 shown in FIG. 1C receives a voltage input signal (such as the signal 130 shown in FIG. 1B) and generates a current output signal (such as the signal 132 shown in FIG. 1B) that is a substantially linear function of the voltage input signal. Hence, the amplifier 100 operates as a linear voltage-to-current converter.

Figure 1D:
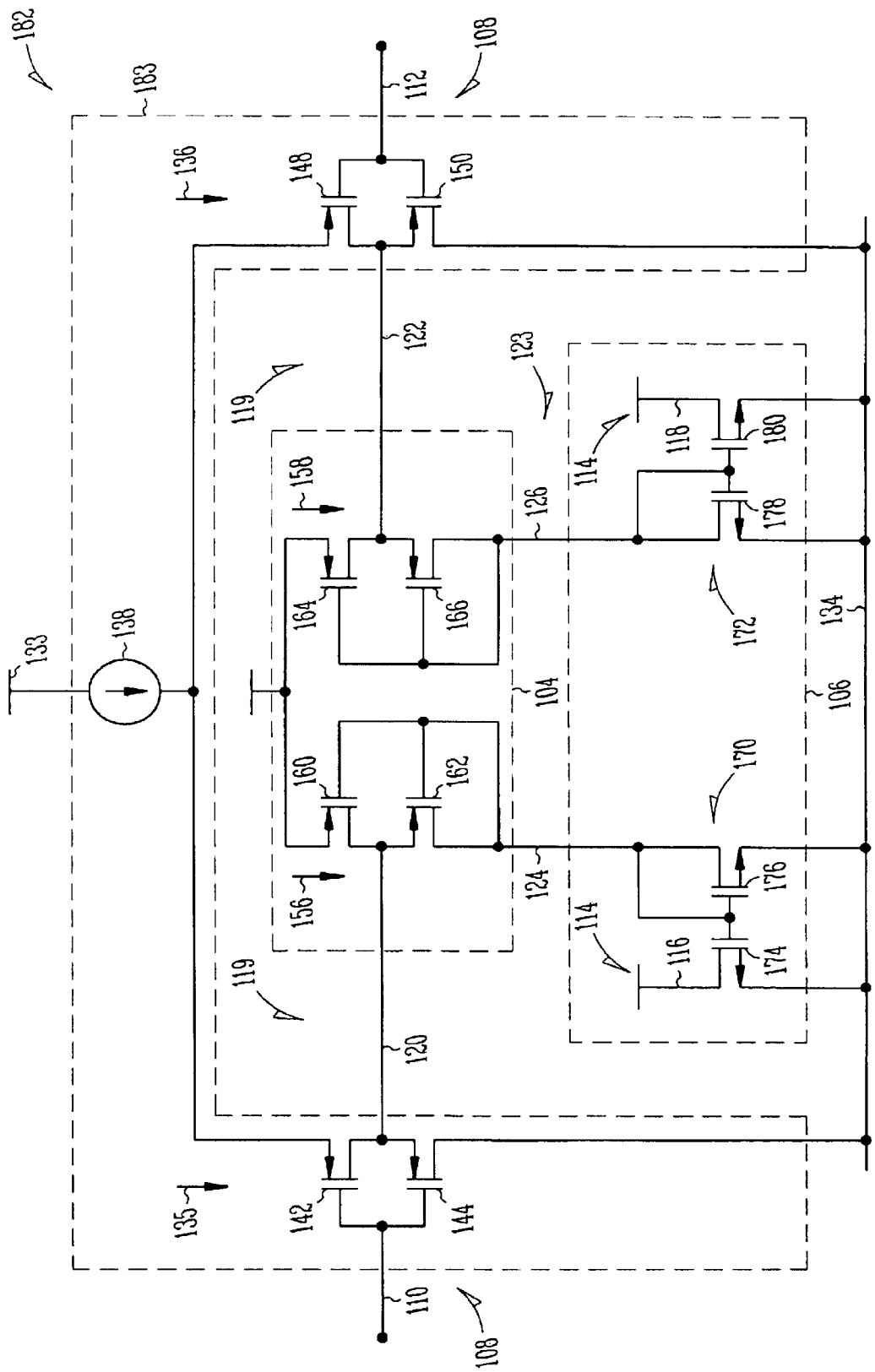
FIG. 1D is a schematic diagram of an amplifier that includes all of the elements of the amplifier shown in FIG. 1C except for the diode connected insulated gate field-effect transistors in the differential unit of the amplifier shown in FIG. 1C in accordance with another embodiment of the present invention.

FIG. 1D is a schematic diagram of an amplifier 182 that includes all of the elements of the amplifier 100 shown in FIG. 1C except for the diode connected insulated gate field-effect transistors 140 and 146 in the differential unit 102 of the amplifier 100 shown in FIG. 1C in accordance with another embodiment of the present invention. The pair of insulated gate field-effect transistors 142 and 144 and the pair of insulated gate field-effect transistors 148 and 150 in a differential unit 183 are coupled directly to the node 134. The pair of insulated gate field-effect transistors 142 and 144 and the pair of insulated gate field-effect transistors 148 and 150 are coupled to the second supply potential provided at the node 134 rather than to a potential one diode drop away from the second supply potential provided at the node 134 (as in FIG. 1C). The operation of the differential unit 183 is substantially similar to the operation of the differential unit 102 shown in FIG. 1C and described above. The operation of the amplifier 182 is substantially similar to the operation of the amplifier 100 shown in FIG. 1C and described above.

Figure 1E:
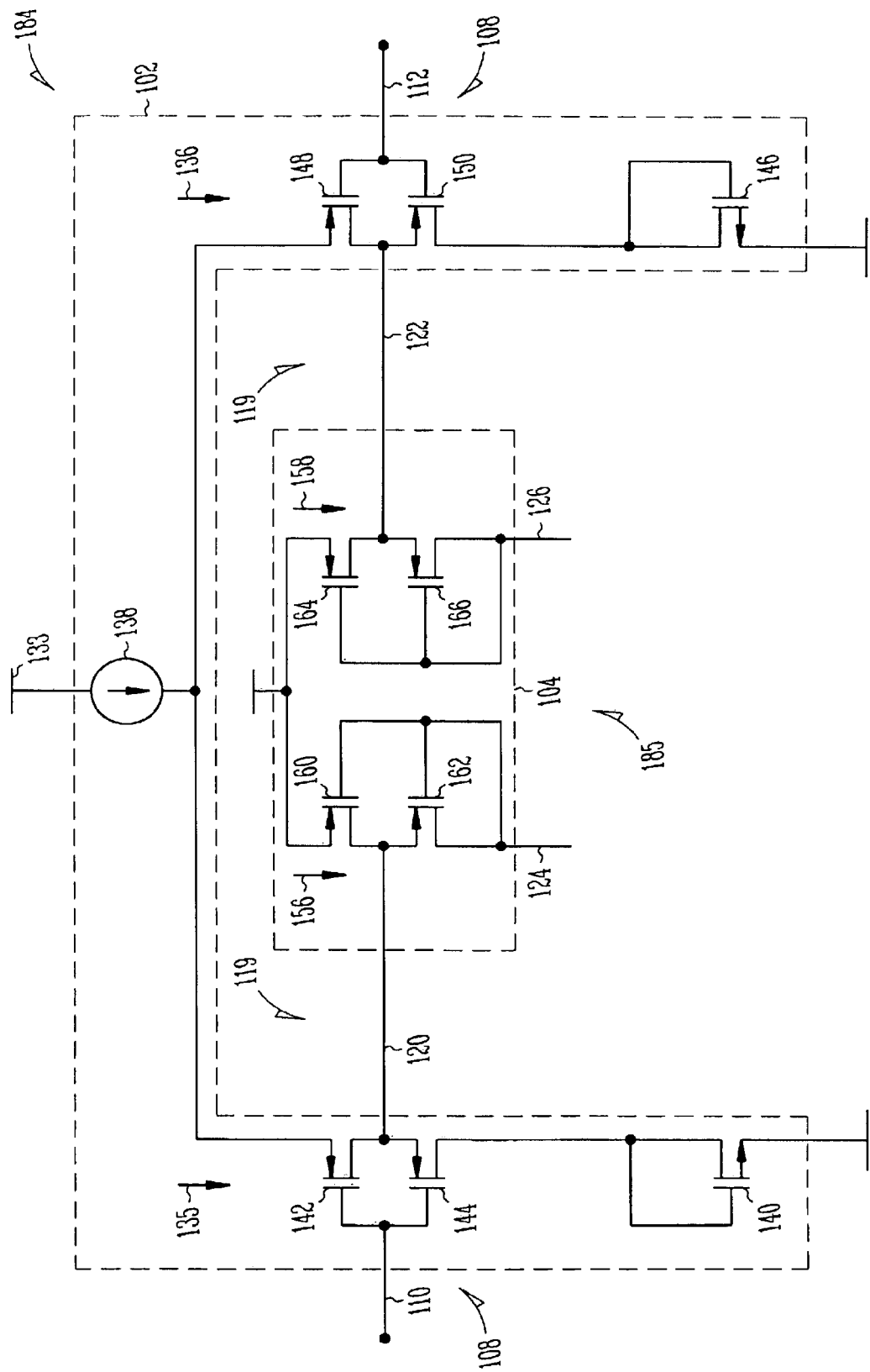
FIG. 1E is a schematic diagram of an amplifier that includes all of the elements of the amplifier shown in FIG. 1C except for the current mirror of the amplifier shown in FIG. 1C in accordance with another embodiment of the present invention.

FIG. 1E is a schematic diagram of an amplifier 184 that includes all of the elements of the amplifier 100 shown in FIG. 1C except for the current mirror 106 of the amplifier 100 shown in FIG. 1C in accordance with another embodiment of the present invention. Removing the current mirror 106 from the amplifier 100 transforms the coupling port 123 of the amplifier 100 into an output port 185 including terminals 124 and 126. The amplifier 184 provides the currents in the current paths 156 and 158 at the terminals 124 and 126. The operation of the amplifier 184 is substantially similar to the operation of the amplifier 100 shown in FIG. 1C and described above.

Figure 1F:
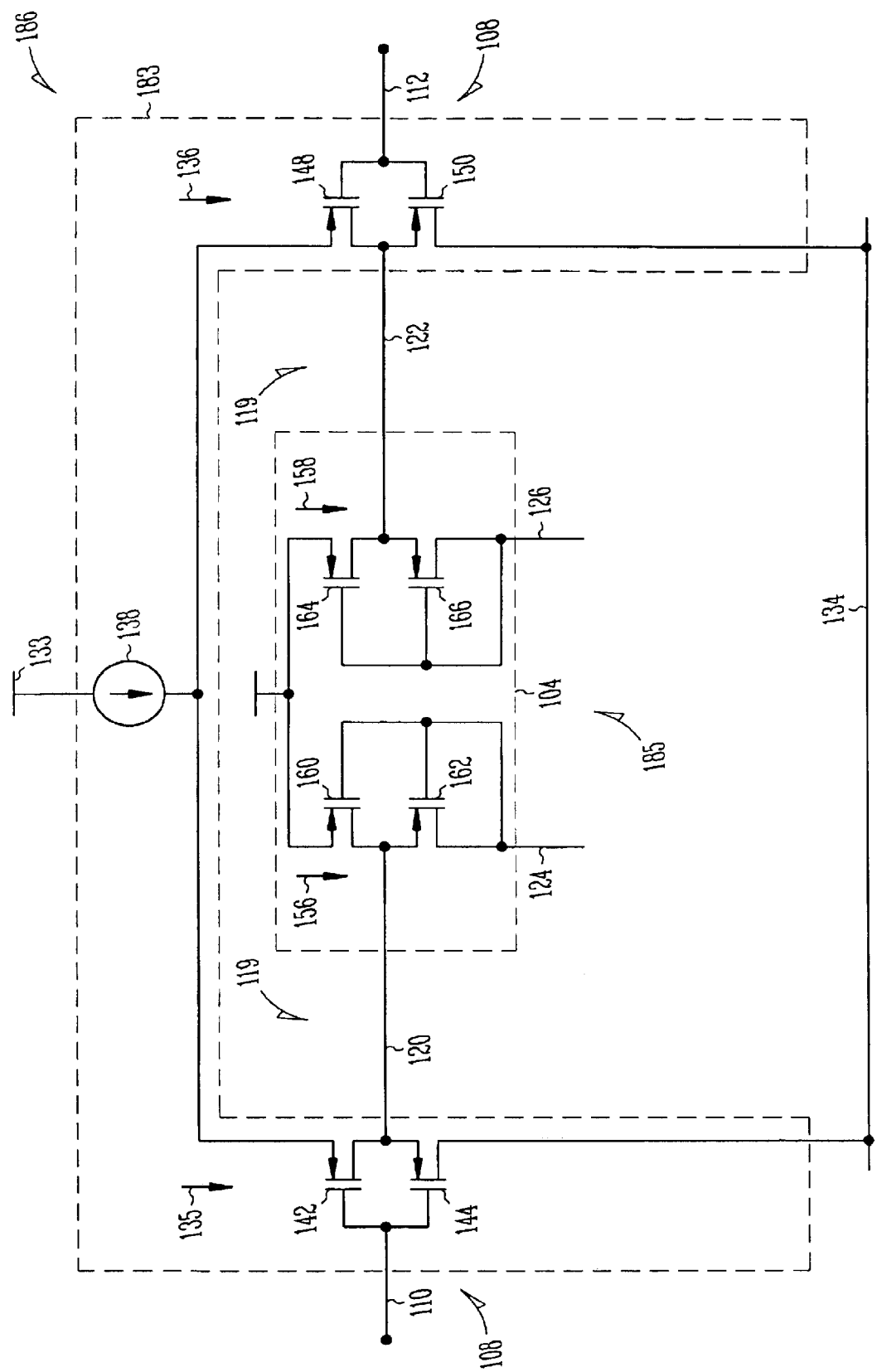
FIG. 1F is a schematic diagram of an amplifier that includes all of the elements of the amplifier shown in FIG. 1C except for the diode connected insulated gate field-effect transistors in the differential unit in the amplifier shown in FIG. 1C and the current mirror in the amplifier shown in FIG. 1C in accordance with another embodiment of the present invention.

FIG. 1F is a schematic diagram of an amplifier 186 that includes all of the elements of the amplifier 100 shown in FIG. 1C except for the diode connected insulated gate field-effect transistors 140 and 146 in the differential unit 102 in the amplifier 100 shown in FIG. 1C and the current mirror 106 in the amplifier 100 shown in FIG. 1C in accordance with another embodiment of the present invention. The pair of insulated gate field-effect transistors 142 and 144 and the pair of insulated gate field-effect transistors 148 and 150 in the differential unit 183 are coupled directly to the node 134. The pair of insulated gate field-effect transistors 142 and 144 and the pair of insulated gate field-effect transistors 148 and 150 are coupled to the second supply potential provided at the node 134 rather than to a potential one diode drop away from the second supply potential provided at the node 134 (as in FIG. 1C). The operation of the differential unit 183 is substantially similar to the operation of the differential unit 102 shown in FIG. 1C and described above. Removing the current mirror 106 from the amplifier 100 transforms the coupling port 123 of the amplifier 100 into an output port 185 including terminals 124 and 126. The amplifier 186 provides the currents in the current paths 156 and 158 at the terminals 124 and 126. The operation of the amplifier 186 is substantially similar to the operation of the amplifier 100 shown in FIG. 1C and described above.

Figure 1G:
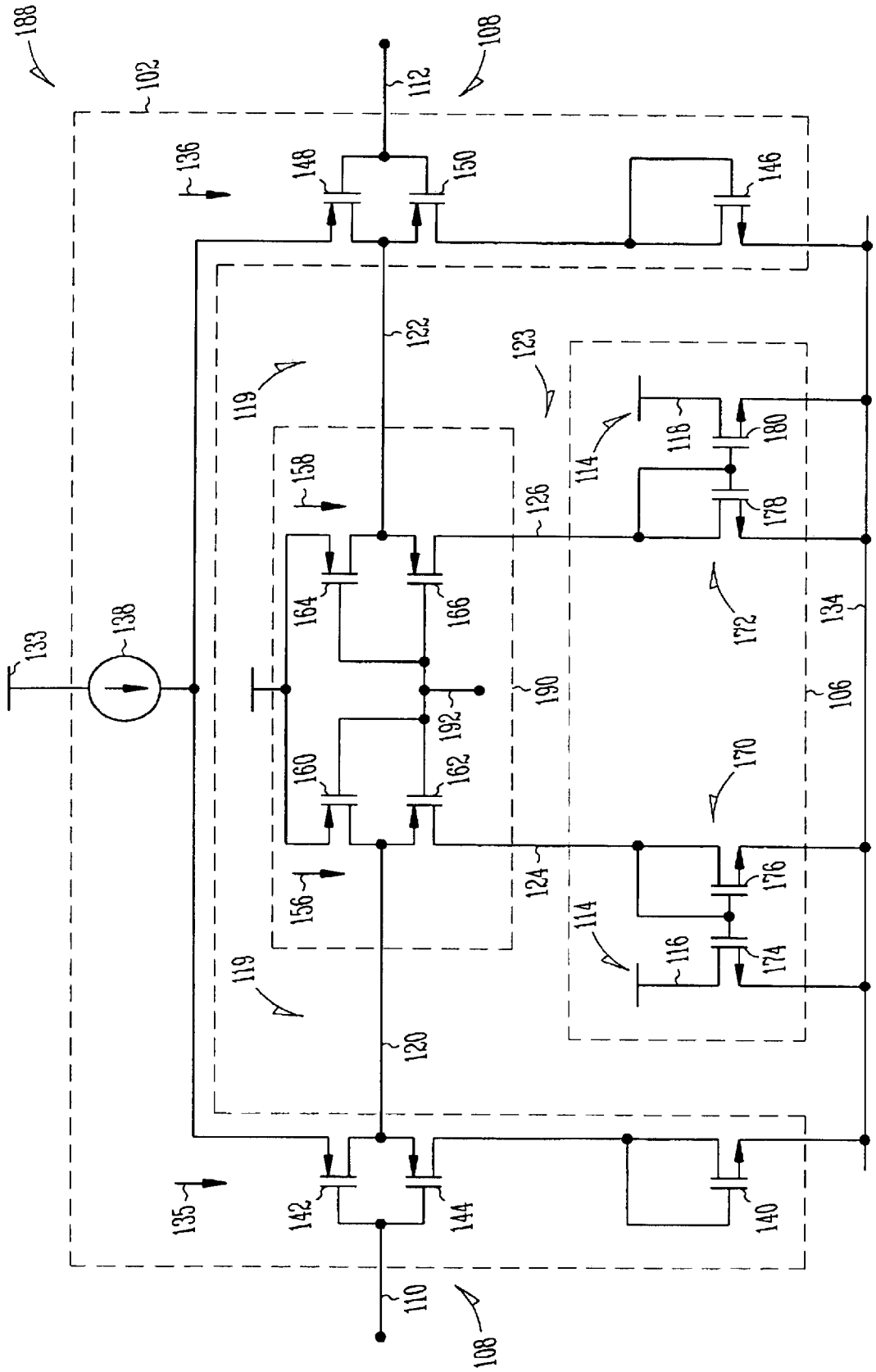
FIG. 1G is a schematic diagram of an amplifier that includes all of the elements of the amplifier shown in FIG. 1C except the amplifier substitutes a voltage-to-current conversion unit that includes a bias terminal for the voltage-to-current conversion unit of the amplifier shown in FIG. 1C in accordance with another embodiment of the present invention.

FIG. 1G is a schematic diagram of an amplifier 188 that includes all of the elements of the amplifier 100 shown in FIG. 1C except the amplifier 188 substitutes a voltage-to-current conversion unit 190 that includes a bias terminal 192 for the voltage-to-current conversion unit 104 of the amplifier 100 shown in FIG. 1C in accordance with another embodiment of the present invention. A two operation process converts the voltage-to-current conversion unit 104 to the voltage-to-current conversion unit 190. First, the gates of the pair of insulated gate field-effect transistors 160 and 162 and the gates of the pair insulated gate field-effect transistors 164 and 166 are decoupled from the terminals 124 and 126. Second, the bias terminal 192 is connected to the gate of each insulated gate field-effect transistor of the pair of insulated gate field-effect transistors 160 and 162 and the gate of each insulated gate field-effect transistor of the pair of insulated gate field-effect transistors 164 and 166. In operation, a bias potential (not shown) connected to the bias terminal 192 controls the bias currents in the current paths 156 and 158. Otherwise, the operation of the amplifier 188 is substantially similar to the operation of the amplifier 100 shown in FIG. 1C.

Figure 1H:
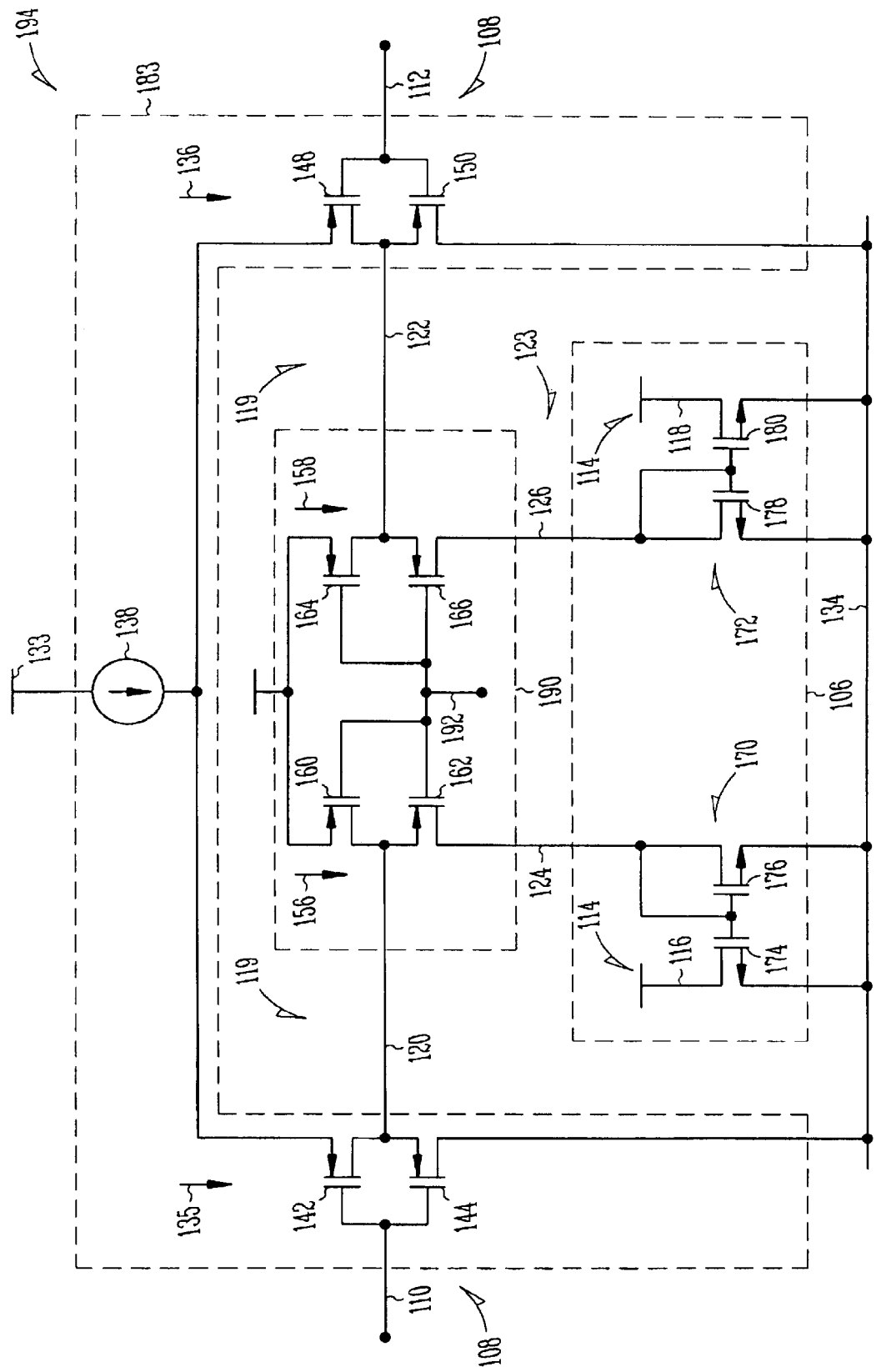
FIG. 1H is a schematic diagram of an amplifier that includes all of the elements of the amplifier shown in FIG. 1G except for the diode connected insulated gate field-effect transistors in the differential unit of the amplifier shown in FIG. 1G in accordance with another embodiment of the present invention.
Figure 11:
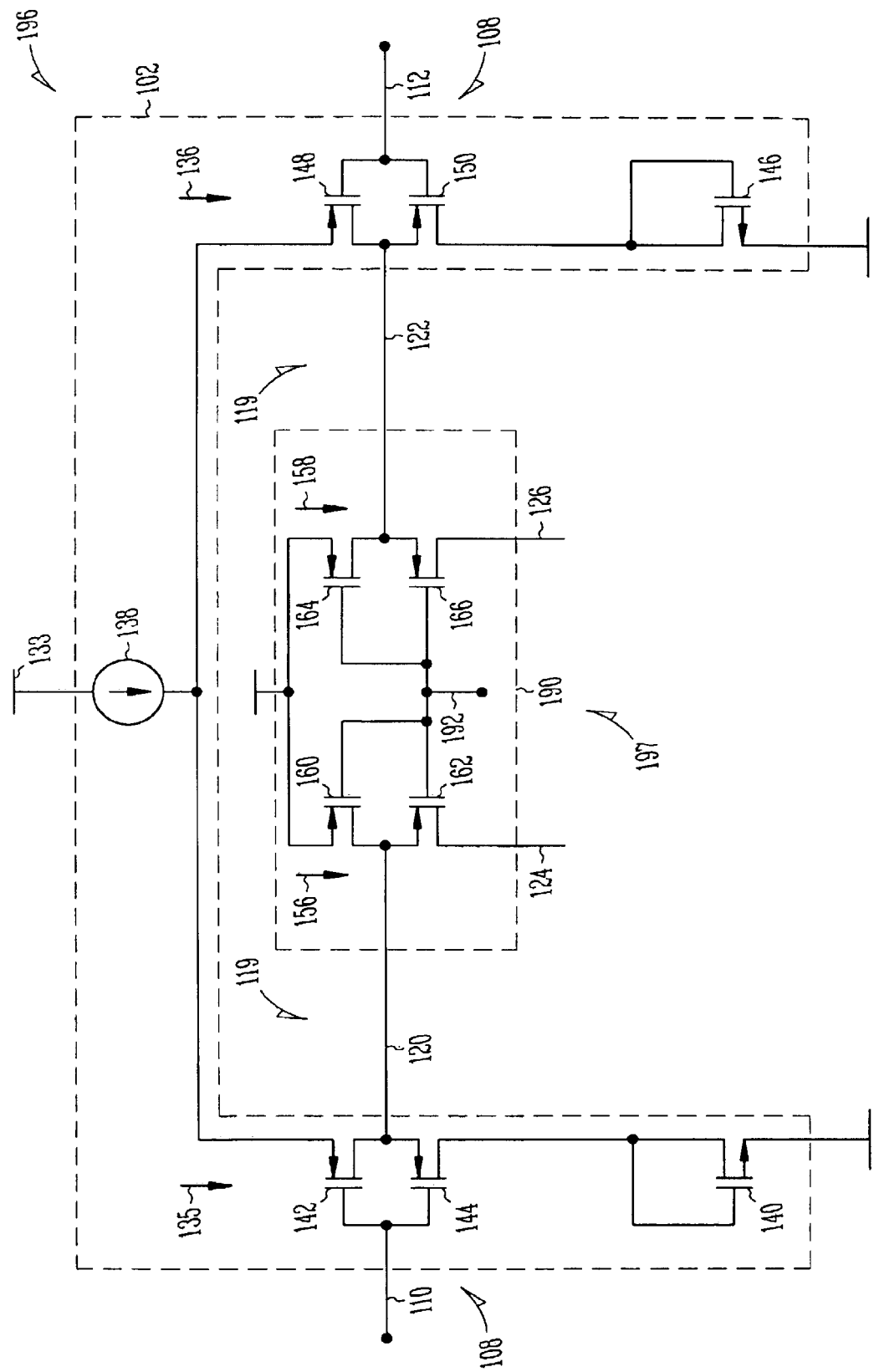

FIG. 1H is a schematic diagram of an amplifier 194 that includes all of the elements of the amplifier 188 shown in FIG. 1G except for the diode connected insulated gate field-effect transistors 140 and 146 in the differential unit 102 of the amplifier shown in FIG. 1G in accordance with another embodiment of the present invention. The pair of insulated gate field-effect transistors 142 and 144 and the pair of insulated gate field-effect transistors 148 and 150 are coupled directly to the node 134 in the differential unit 183. The pair of insulated gate field-effect transistors 142 and 144 and the pair of insulated gate field-effect transistors 148 and 150 are coupled to the second supply potential provided at the node 134 rather than to a potential one diode drop away from the second supply potential provided at the node 134 (as in FIG. 1G). The operation of the differential unit 183 is substantially similar to the operation of the differential unit 102 shown in FIG. 1G and described above. The operation of the amplifier 194 is substantially similar to the operation of the amplifier 188 shown in FIG. 1G and described above.

FIG. 1I is a schematic diagram of an amplifier 196 that includes all of the elements of the amplifier 188 shown in FIG. 1G except for the current mirror 106 of the amplifier 188 shown in FIG. 1G in accordance with another embodiment of the present invention. Removing the current mirror 106 from the amplifier 188 transforms the coupling port 123 of the amplifier 188 into an output port 197 including the terminals 124 and 126. The amplifier 196 provides the currents in the current paths 156 and 158 at the terminals 124 and 126. The operation of the amplifier 196 is substantially similar to the operation of the amplifier 188 shown in FIG. 1G and described above.

Figure 1J:
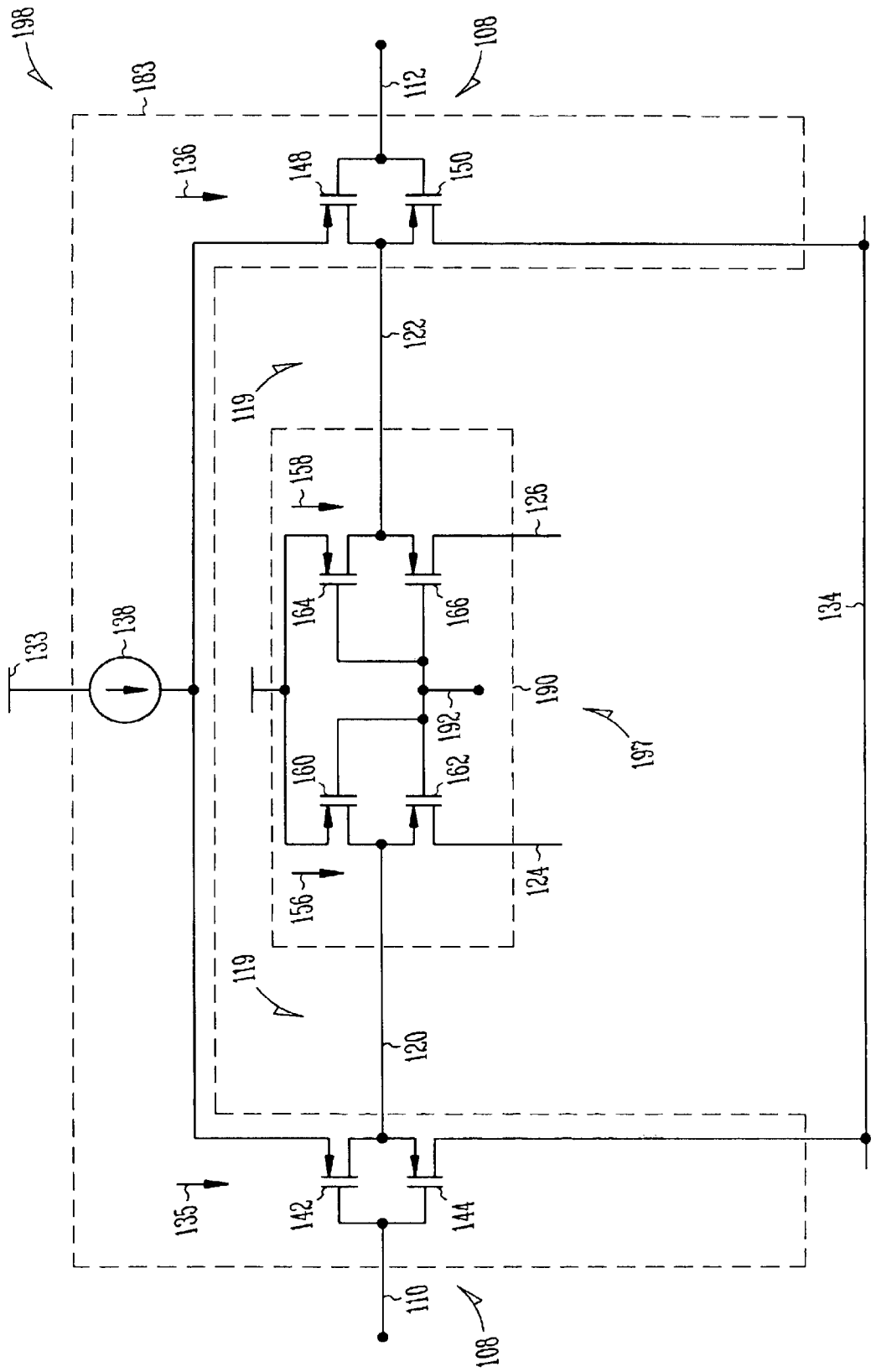
FIG. 1J is a schematic diagram of an amplifier that includes all of the elements of the amplifier shown in FIG. 1G except for the diode connected insulated gate field-effect transistors in the differential unit in the amplifier shown in FIG. 1G and the current mirror in the amplifier shown in FIG. 1G in accordance with another embodiment of the present invention.

FIG. 1J is a schematic diagram of an amplifier 198 that includes all of the elements of the amplifier 188 shown in FIG. 1G except for the diode connected insulated gate field-effect transistors 140 and 146 in the differential unit 102 in the amplifier 188 shown in FIG. 1G and the current mirror 106 in the amplifier 188 shown in FIG. 1G in accordance with another embodiment of the present invention. The pair of insulated gate field-effect transistors 142 and 144 and the pair of insulated gate field-effect transistors 148 and 150 are coupled directly to the node 134 in the differential unit 183. The pair of insulated gate field-effect transistors 142 and 144 and the pair of insulated gate field-effect transistors 148 and 150 are coupled to the second supply potential provided at the node 134 rather than to a potential one diode drop away from the second supply potential provided at the node 134 (as in FIG. 1G). The operation of the differential unit 183 is substantially similar to the operation of the differential unit 102 shown in FIG. 1G and described above. Removing the current mirror 106 from the amplifier 188 transforms the coupling port 123 of the amplifier 188 into the output port 197 including the terminals 124 and 126. The amplifier 198 provides the currents in the current paths 156 and 158 at the terminals 124 and 126. The operation of the amplifier 198 is substantially similar to the operation of the amplifier 188 shown in FIG. 1G and described above.

Each of the amplifier embodiments shown in FIGS. 1C, 1D, 1E, 1F, 1G, 1H, 1I, and 1J can operate as a single-ended amplifier. For example, referring to FIG. 1C, applying a signal at the input terminal 112 that turns off the pair of insulated gate field-effect transistors 148 and 150 transforms the amplifier 100 into a single ended amplifier. A voltage signal applied at the input terminal 110 produces a current signal at the output terminal 116. In addition, each of the amplifiers shown in FIGS. 1C, 1D, 1E, 1F, 1G, 1H, 1I, and 1J is a differential amplifier that has a symmetrical topology that defines two single-ended amplifiers. Either of the two single-ended amplifiers defined by the differential amplifier can be formed separately as a stand alone single-ended amplifier. For example, the pair of insulated gate field-effect transistors 142 and 144, the diode connected insulated gate field-effect transistor 140, the pair of insulated gate field-effect transistors 160 and 162, and the current mirror 170 connected as shown in FIG. 1C forms a single-ended amplifier.

Figure 2:
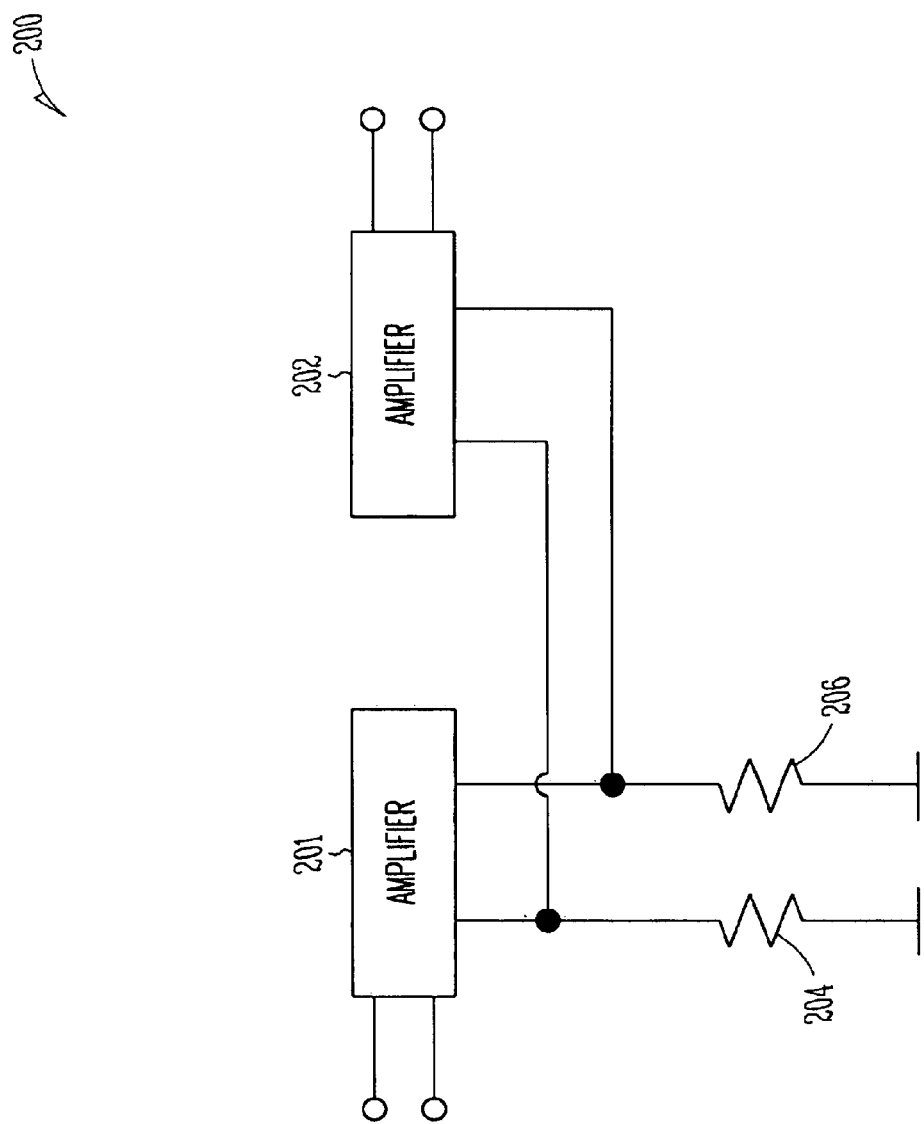
FIG. 2 is a block diagram of an information processing unit including an amplifier coupled in parallel with another amplifier in accordance with another embodiment of the present invention.

FIG. 2 is a block diagram of an information processing unit 200 including an amplifier 201 coupled in parallel with an amplifier 202 in accordance with another embodiment of the present invention. The information processing unit 200 is not limited to use in connection with a particular type of amplifier. Some amplifier embodiments suitable for use in connection with the information processing unit 200 are shown in FIGS. 1A, 1C, 1D, 1E, 1F, 1G 1H, 1I, and 1J. Resistors 204 and 206 provide summing nodes to generate a sum of the current output signals from the amplifier 201 and the amplifier 202. A plurality of amplifiers are coupled in parallel to generate a sum of the current output signals of the plurality of amplifiers. The use of amplifiers having a fast transient response permit a high frequency input signal at the amplifiers to be quickly coupled to the summing nodes provided at the resistors 204 and 206.

Figure 3:
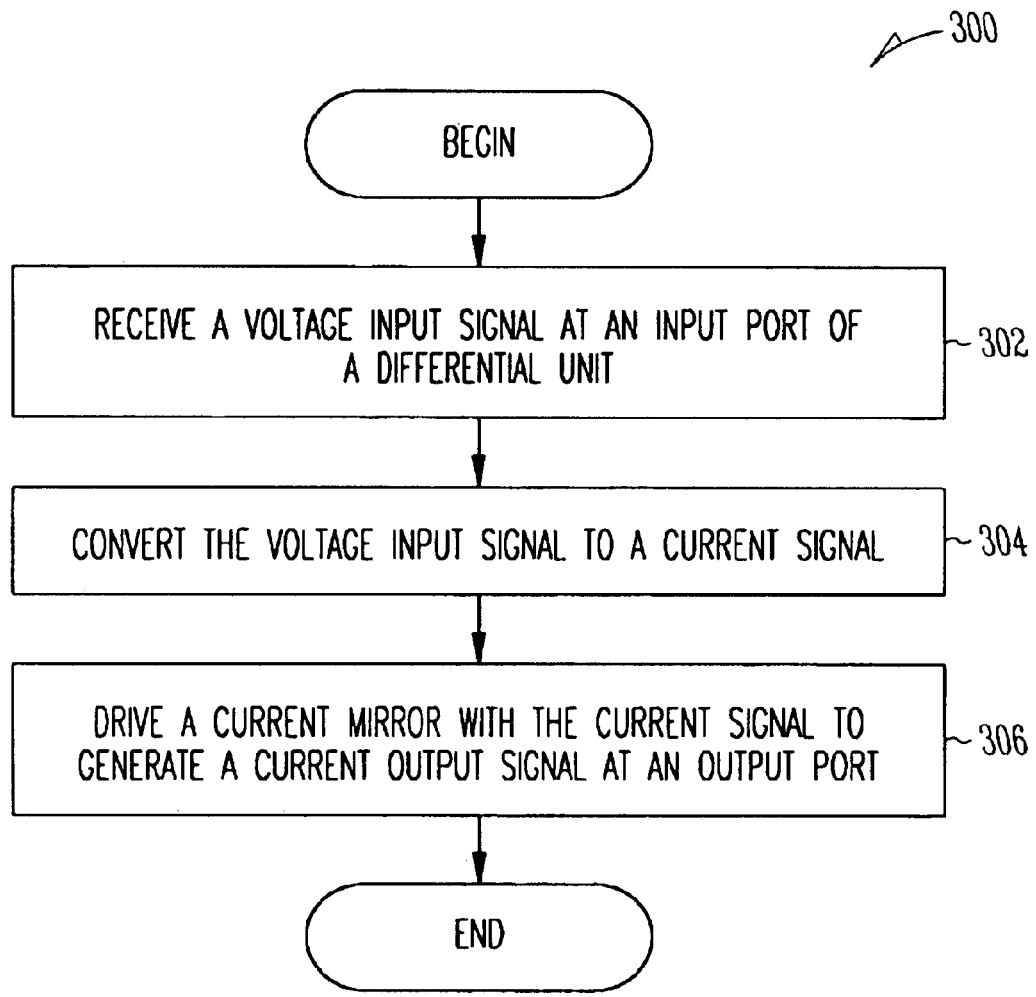
FIG. 3 is a flow diagram of a method of processing a voltage signal to generate a current signal in accordance with another embodiment of the present invention.

FIG. 3 is a flow diagram of a method 300 of processing a voltage signal to generate a current signal in accordance with another embodiment of the present invention. The method 300 includes three operations. In one operation, the method 300 includes receiving a voltage input signal at an input port of a differential unit (block 302). In another operation, the method 300 includes converting the voltage input signal to a current signal (block 304). In another operation, the method 300 includes driving a current mirror with the current signal to generate a current output signal at an output port (block 306). In another embodiment, receiving the voltage input signal at the input port of the differential unit includes receiving a differential voltage input signal. In another embodiment, converting the voltage input signal to a current signal includes providing a voltage signal at a common drain/source node of a pair of active cascode connected insulated gate field-effect transistors.

Figure 4:
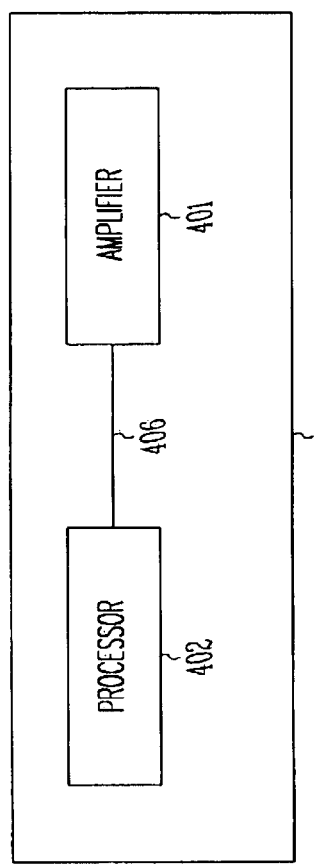
FIG. 4 is a block diagram of a processor-amplifier unit including an amplifier and a processor formed on a die in accordance with another embodiment of the present invention.

FIG. 4 is a block diagram of a processor-amplifier unit 400 including an amplifier 401 and a processor 402 formed on a die 404 in accordance with another embodiment of the present invention. The processor-amplifier unit 400 is not limited to use in connection with a particular type of amplifier. Some amplifier embodiments suitable for use in connection with the processor-amplifier unit 400 are shown in FIGS. 1A, 1C, 1D, 1E, 1F, 1G, 1H, 1I, and 1J. The processor 402 is coupled to the amplifier 401 through an interconnect 406. Exemplary interconnects suitable for use in connection with the processor-amplifier unit 400 include transmission lines and integrated circuit conductive traces. A conductive trace is fabricated by forming a conductive material on a substrate. Exemplary materials suitable for use in the fabrication of conductive traces include polysilicon and metals, such as copper, alloys of copper, aluminum, and alloys of aluminum. The processor-amplifier unit 400 provides an amplifier 401 for driving high speed signals both on and off the die 404. The processor 402 provides signals to the amplifier 401. The processor-amplifier unit 400 is not limited to use in connection with a particular type of processor. In one embodiment, the processor 402 includes a reduced instruction set processor. In another embodiment, the processor 402 includes a very long instruction word processor. The processor-amplifier unit 400 is not limited to use in connection with a die formed from a particular material. In one embodiment, the die 404 is formed from silicon. The amplifier 401 in the processor-amplifier 400 is not limited to being fabricated from transistors formed from a particular material type. In one embodiment, the amplifier 401 includes n-type insulated gate field-effect transistors.

Figure 5:
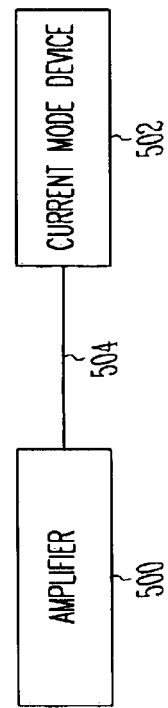
FIG. 5 is a block diagram of an amplifier coupled to a current mode device in accordance with yet another embodiment of the present invention.

FIG. 5 is a block diagram of an amplifier 500 coupled to a current mode device 502 in accordance with yet another embodiment of the present invention. An interconnect 504 couples the amplifier 500 to the current mode device 502. Interconnects suitable for use in connection with the amplifier 500 and the current mode device 502 include transmission lines and conductive interconnects formed on a substrate. The amplifier 500 is not limited to a particular type of amplifier. Some amplifier embodiments suitable for use in connection with the current mode device 502 are shown in FIGS. 1A, 1C, 1D, 1E, 1F, 1G, 1H, 1I, and 1J.

In operation, the current mode device 502 receives a current signal from the amplifier 500 and generates an electrical, optical or other type of signal. Some magnetic devices and some optical devices are current mode devices. For example, magnetic recording heads, which are devices that record magnetic signals on magnetic media, such as magnetic disk or tape or flexible or fixed magnetic media, are current mode devices. In operation, a magnetic recording head receives a current signal and generates a magnetic field. The magnetic head is positioned near a magnetic recording surface, such as a magnetic film, to generate a magnetic field that sets the magnetization in the magnetic recording surface. Thus, in one embodiment, the current mode device 502 includes a magnetic recording head. Traditional magnetic recording heads include inductors and are often fabricated by machining and other metal working processes. Modem magnetic recording heads are fabricated using integrated circuit manufacturing technologies. However, the magnetic recording heads fabricated using integrated circuit manufacturing technologies are also current mode devices and operate in a manner similar to traditional magnetic recording heads. Thus, in another embodiment, the current mode device 502 includes a thin-film magnetic recording head. Some optical devices are also current mode devices. For example, lasers and light-emitting diodes receive a current signal and generate an optical signal. Thus, in another embodiment, the current mode device 502 includes an optical device. In another embodiment, the current mode device 502 includes a laser. In yet another embodiment, the current mode device 502 includes a light-emitting diode.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. An amplifier comprising:
   a differential unit including an input port to receive a voltage input signal;
   a current mirror unit including an output port;
   a voltage-to-current conversion unit to couple the differential unit to the current minor unit and to generate a current signal to drive the current minor unit to generate a current output signal at the output port, wherein the differential unit comprises:
   a current source;
   a diode connected insulated gate field-effect transistor; and
   a pair of insulated gate field-effect transistors coupled to the current source and the diode connected insulated gate field-effect transistor, wherein the diode connected insulated gate field-effect transistor comprises an n-type insulated gate field-effect transistor and the pair of insulated gate field-effect transistors comprise a common drain/source node and an active cascode connected pair of insulated gate field-effect transistors having a common gate node comprising the input port.

2. The amplifier of claim 1, wherein the common drain/source node is coupled to the voltage-to-current conversion unit.

3. The amplifier of claim 2, wherein each of the pair of insulated gate field effect transistors comprises an n-type insulated gate field effect transistor.

4. An amplifier comprising:
   a differential unit including an input port to receive a voltage input signal;
   a current mirror unit including an output port; and
   a voltage-to-current conversion unit to couple the differential unit to the current mirror unit and to generate a current signal to drive the current mirror unit to generate a current output signal at the output port, wherein the voltage-to-current conversion unit comprises a pair of active cascode connected insulated gate field-effect transistors having a common drain/source node coupled to the differential unit and a common gate node coupled to a drain/source node of one of the pair of active cascode connected insulated gate field-effect transistors.

5. The amplifier of claim 4, wherein one of the pair of active cascode connected insulated gate field-effect transistors operates in the linear region.

6. The amplifier of claim 4, wherein each of the pair of active cascode connected insulated gate field-effect transistors comprises an n-type insulated gate field effect transistor.

7. The amplifier of claim 6, wherein the common gate node is coupled to the current mirror.

8. An amplifier comprising:
   a differential unit including an input port to receive a input voltage signal; and
   a voltage-to-current conversion unit including a pair of active cascode connected insulated gate field-effect transistors coupled to the differential unit, the voltage-to-current conversion unit to generate a output current signal at an output port, wherein the current output signal is linearly related to the voltage input signal, the voltage-to-current conversion unit includes a bias terminal for controlling a bias current in the voltage-to-current conversion unit, and the differential unit includes a pair of insulated gate field-effect transistors including a drain/source-to-drain/source connection and the voltage-to-current conversion unit includes a pair of insulated gate field-effect transistors including a drain/source-to-drain/source connection coupled to the drain/source-to-drain/source connection of the pair of insulated gate field-effect transistors of the differential unit.

9. An amplifier comprising:
   a differential unit including an input port to receive a voltage input signal;
   a current mirror unit including an output port; and
   a voltage-to-current conversion unit including two pair of active cascode connected insulated gate field-effect transistors, the voltage-to-current conversion unit to couple the differential unit to the current mirror unit and to generate a current signal to drive the current mirror unit to generate a current output signal at the output port, wherein the current output signal is a substantially linear function of the voltage input signal.

10. The amplifier of claim 9, wherein each of the two pair of active cascode connected insulated gate field-effect transistors includes an insulated gate field-effect transistor that operates in a triode mode.

11. The amplifier of claim 10, wherein each of the two pair of active cascode connected insulated gate field-effect transistors includes an insulated gate field-effect transistor that operates in a saturation mode.

12. An information processing unit comprising:
    a plurality of amplifiers coupled in parallel to sum a plurality of current output signals, wherein at least one of the plurality of amplifiers includes a differential unit and a voltage-to-current conversion unit, the differential unit including a first common drain/source node and the voltage-to-current conversion unit including a second common drain/source node coupled to the first common drain/source node.

13. The information processing unit of claim 12, wherein the voltage-to-current conversion unit includes a common gate node coupled to a current source.

14. The information processing unit of claim 13, wherein the differential unit includes a common gate node coupled to an input port.

* * * * *

UNITED STATES PATENT AND TRADEMARK OFFICE
CERTIFICATE OF CORRECTION

PATENT NO. : 6,856,198 B2  Page 1 of 1
APPLICATION NO. : 10/328726
DATED : February 15, 2005
INVENTOR(S) : Jaussi et al.

It is certified that error appears in the above-identified patent and that said Letters Patent is hereby corrected as shown below:

On the Title page, in Item (57), under "Abstract", in column 2, line 10, delete "an" and insert -- a --, therefor.

In column 11, line 26, in Claim 1, delete "minor" and insert -- mirror --, therefor.

In column 11, line 27, in Claim 1, delete "minor" and insert -- mirror --, therefor.

Signed and Sealed this

Thirtieth Day of December, 2008

JON W. DUDAS
*Director of the United States Patent and Trademark Office*